(12) United States Patent
Hwang et al.

(10) Patent No.: US 10,798,830 B2
(45) Date of Patent: Oct. 6, 2020

(54) DISPLAY APPARATUS

(71) Applicant: Samsung Electronics Co., Ltd., Suwon-si, Gyeonggi-do (KR)

(72) Inventors: Kwang Sung Hwang, Suwon-si (KR); Yoon Ah Kim, Suwon-si (KR); Sang Ki Yoon, Suwon-si (KR); Huu Lam Vuong Nguyen, Suwon-si (KR); Jin Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/551,035

(22) Filed: Aug. 26, 2019

(65) Prior Publication Data

US 2020/0068726 A1    Feb. 27, 2020

Related U.S. Application Data

(60) Provisional application No. 62/722,282, filed on Aug. 24, 2018.

(30) Foreign Application Priority Data

Nov. 8, 2018    (KR) .................... 10-2018-0136841

(51) Int. Cl.
*H05K 5/00* (2006.01)
*E05C 19/16* (2006.01)
(Continued)

(52) U.S. Cl.
CPC .......... *H05K 5/0017* (2013.01); *E05C 19/16* (2013.01); *E05C 19/18* (2013.01); *H05K 5/0221* (2013.01); *E05Y 2201/46* (2013.01)

(58) Field of Classification Search
CPC .... H05K 5/0017; H05K 5/0221; E05C 19/18; E05C 19/16; E05Y 2201/46;
(Continued)

(56) References Cited

U.S. PATENT DOCUMENTS 4,919,464 A * 4/1990 Richards ............. E05B 47/0038
                                                  292/201
5,188,405 A * 2/1993 Maccaferri ........... E05B 47/004
                                                  292/204
(Continued)

FOREIGN PATENT DOCUMENTS

EP    2 868 848 A1    5/2015
GB    2 445 968 A     7/2008
(Continued)

OTHER PUBLICATIONS

Korean Office Action dated Mar. 20, 2019 in corresponding Korean Patent Application No. 10-2018-0136841.
(Continued)

*Primary Examiner* — Rockshana D Chowdhury
(74) *Attorney, Agent, or Firm* — Staas & Halsey LLP

(57) ABSTRACT

Disclosed herein is a display apparatus. The display apparatus includes a display module configured to display a screen, a frame configured to support the display module, a magnetic coupling device configured to couple the frame to the display module by pulling the display module toward the frame by using the magnetic attraction force, and a separation prevention device configured to mechanically prevent the display module from being separated from the frame and configured to be operated by the magnetic force.

15 Claims, 11 Drawing Sheets

(51) Int. Cl.
*H05K 5/02* (2006.01)
*E05C 19/18* (2006.01)

(58) Field of Classification Search
CPC .......... G09G 2300/026; G02F 1/13336; G06F 3/1446; G09F 9/3026
See application file for complete search history.

(56) References Cited

U.S. PATENT DOCUMENTS

| | | | |
|---|---|---|---|
| 9,845,816 B2* | 12/2017 | Brashnyk | ............... F16M 13/02 |
| 10,660,225 B2* | 5/2020 | Schafer | ..................... G09F 9/33 |
| 2014/0003052 A1 | 1/2014 | Hemiller et al. | |
| 2016/0255731 A1* | 9/2016 | Ran | ........................ E05B 15/08 361/807 |

FOREIGN PATENT DOCUMENTS

| | | |
|---|---|---|
| JP | 2018-506748 | 3/2018 |
| KR | 10-2006-0090917 | 8/2006 |
| KR | 10-2008-0006404 | 1/2008 |
| KR | 10-2018-0011983 | 2/2018 |
| WO | WO 2016/109439 A1 | 7/2016 |

OTHER PUBLICATIONS

Korean Office Action dated Jul. 8, 2019 in corresponding Korean Patent Application No. 10-2018-0136841.
Extended European Search Report dated Oct. 25, 2019 in corresponding European Patent Application No. 19193171.6.
International Search Report dated Dec. 20, 2019 in corresponding International Patent Application No. PCT/KR2019/010796.

* cited by examiner

DISPLAY APPARATUS

CROSS-REFERENCE TO RELATED APPLICATION(S)

This application is based on and claims priority under 35 U.S.C. 119 to Korean Patent Application No. 10-2018-0136841, filed on Nov. 8, 2018, in the Korean Intellectual Property Office, and U.S. Provisional Patent Application No. 62/722,282, filed on Aug. 24, 2018, in the U.S. Patent and Trademark Office, the disclosures of which are herein incorporated by reference in their entireties

BACKGROUND

1. Field

The disclosure relates to a display apparatus in which a display module is coupled to a frame by a magnet, and more particularly, to a display apparatus capable of preventing a display module from being separated from a frame.

2. Description of Related Art

A display apparatus is a type of output device that visually displays data information such as characters and graphics, and images. Recently, a display apparatus employing a liquid crystal display (LCD) panel and an organic light emitting diode (OLED) panel has been widely used.

There is growing need of high luminance, high resolution, large-sized, high-efficiency, and low-power display apparatuses. Therefore, a micro light emitting diode (LED) panel that is manufactured by directly mounting an inorganic light emitting diode on a substrate has been researched as a new product to replace or supplement the conventional LCD panel and OLED panel.

The micro LED panel may easily utilize a modular display technology, and the modular display technology is to make a large size screen by generating small sized panels from micro LEDs and tiling the plurality of modules in the vertical and horizontal direction, continuously. In addition, the magnetic force of the magnet may be used for simplicity of the structure and ease of assembly at the time of tiling a plurality of modules in the frame.

However, as for the display apparatus installed on a ceiling or an inclined surface rather than a wall, a constant force may be applied to the plurality of modules in the direction opposite to the direction of the connection, or an unexpected impact may be applied to the display apparatus. Therefore, a safety device is required to prevent the plurality of modules from being separated from the frame.

SUMMARY

Therefore, it is an aspect of the present disclosure to provide a display apparatus capable of preventing a plurality of display modules installed in a frame, from being separated from the frame.

Additional aspects of the present disclosure will be set forth in part in the description which follows and, in part, will be obvious from the description, or may be learned by practice of the present disclosure.

In accordance with an aspect of the disclosure, a display includes a frame, a display module including at least one substrate on which a plurality of light emitting elements is mounted, and a bracket to which the at least one substrate is attached, a magnetic coupling device configured to couple the frame to the display module by pulling the display module toward the frame by using the magnetic attraction force, and a separation prevention device configured to mechanically prevent the display module from being separated from the frame and configured to be operated by the magnetic force.

The separation prevention device may include a catch fixed to the display module, and a latch installed in the frame to be rotatable between a locking position where the latch is locked in the catch, and an unlocking position where the locking between the latch and the catch is released.

The latch may be rotatable between the locking position and the unlocking position by the magnetic force.

When one of the N pole and the S pole is moved to the front of the latch, the latch may be rotated from the unlocking position to the locking position by the magnetic attraction force and when the other of the N pole and the S pole is moved to the front of the latch, the latch may be rotated from the locking position to the unlocking position by the magnetic repulsion force.

A magnet may be mounted to the latch.

The display apparatus may further include a first magnetic member installed in the bracket to fix the latch to the locking position by using the magnetic attraction force.

The first magnetic member may include a coupling member configured to fix the catch to the bracket.

The display apparatus may further include a second magnetic member installed in the frame to fix the latch to the unlocking position by using the magnetic attraction force.

The separation prevention device may include a shaft member configured to couple the latch to the frame and configured to form a rotational axis of the latch.

A locking hole may be formed in the catch, and the latch may include a locking protrusion inserted and locked in the locking hole.

The catch may be fixed to a back surface of the bracket.

The frame may have a rectangular frame shape including a vertical frame and a horizontal frame, and the separation prevention device may be placed on the vertical frame.

The rotational axis of the latch may be in parallel to the horizontal frame.

The magnetic coupling device may include a plurality of magnetic coupling devices installed at corners of the frame, and the separation prevention device may include a plurality of separation prevention devices installed among the plurality of magnetic coupling devices.

In accordance with another aspect of the disclosure, a display apparatus includes a frame, a display module coupled to the frame by the magnetic force, a catch installed on a back surface of the display module, and a latch installed in the frame, and configured to be rotatable to be locked in the catch upon the approach of the magnet.

The display module may include a bracket, and at least one substrate attached to a front surface of the bracket and provided with a plurality of light emitting elements mounted on the at least one substrate.

The display apparatus may further include a magnet mounted to the latch.

The display apparatus may further include a magnetic member installed in the bracket and the frame to fix the latch by using the magnetic attraction force.

The display module may be mechanically prevented from being separated from the frame because a locking protrusion of the latch is inserted and locked in a locking hole of the catch.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
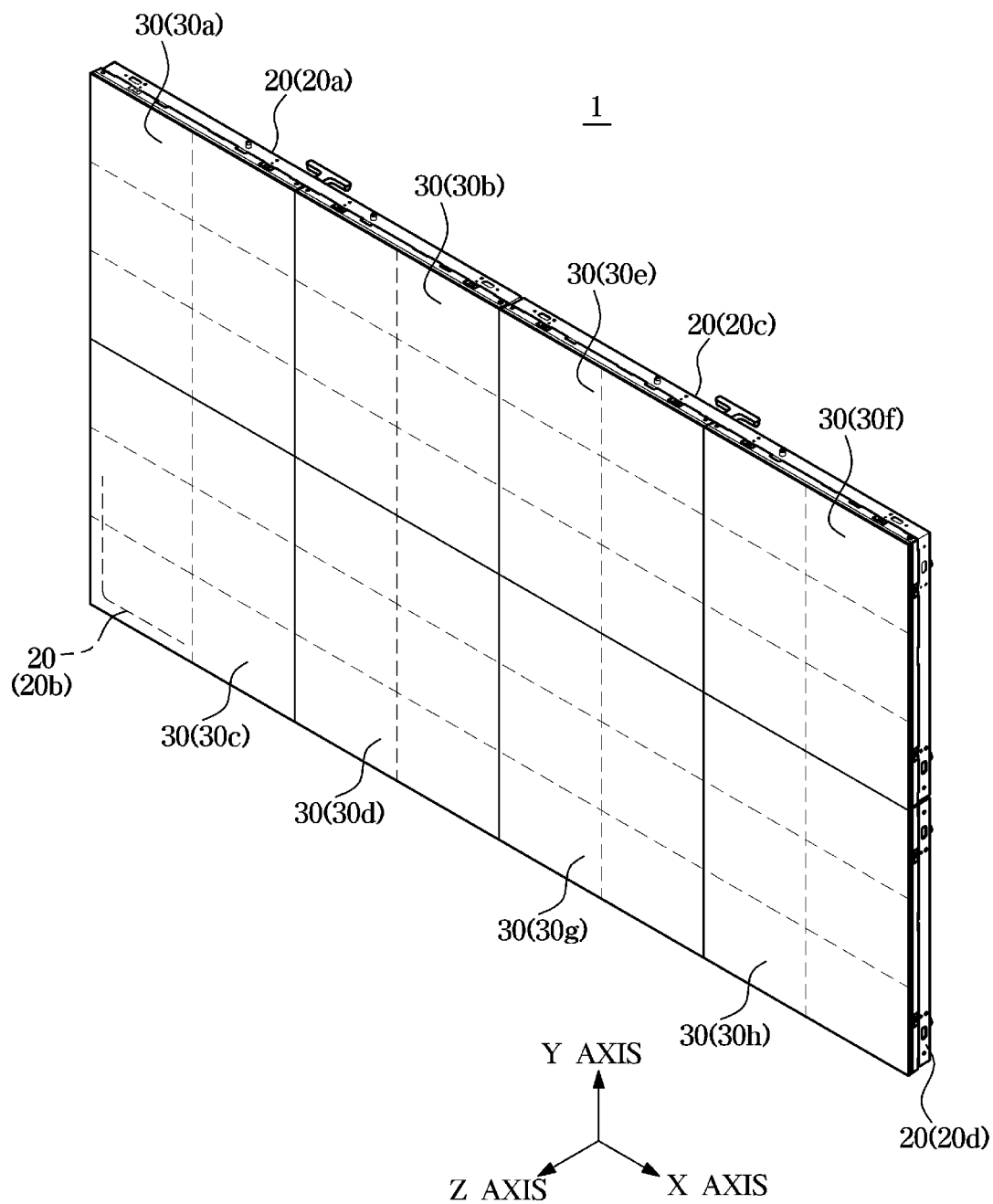
FIG. 1 is a view of a display apparatus according to an embodiment of the disclosure.

Embodiments described in the present disclosure and configurations shown in the drawings are merely examples of the embodiments of the present disclosure, and may be modified in various different ways at the time of filing of the present application to replace the embodiments and drawings of the present disclosure.

The singular forms "a," "an" and "the" may be intended to include the plural forms as well, unless the context clearly indicates otherwise. The shape and size of each component illustrated in the drawings may be enlarged for clear expressions In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

Reference will now be made in detail to embodiments of the disclosure, examples of which are illustrated in the accompanying drawings.

Figure 2:
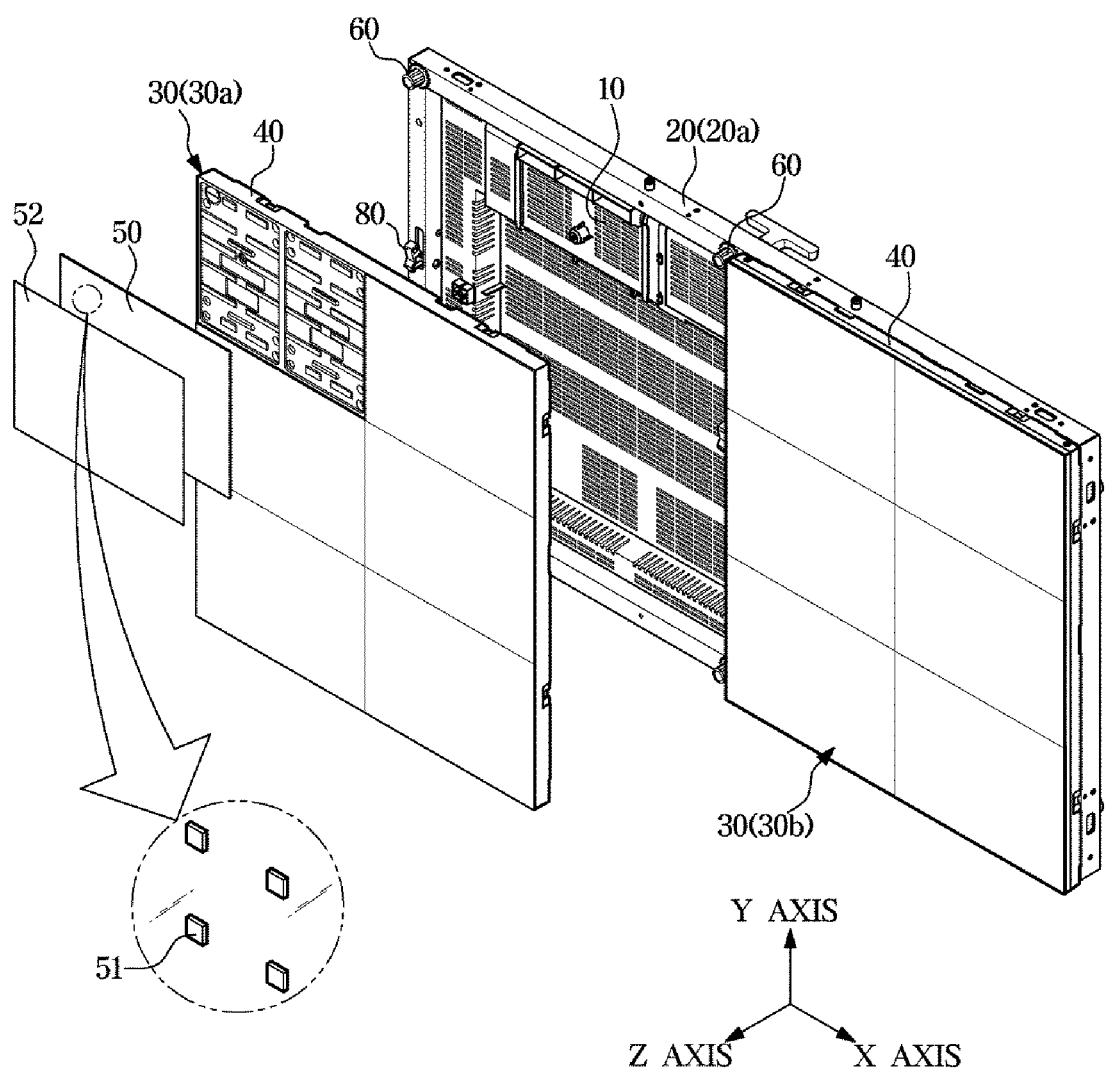
FIG. 2 is a view of a frame and a display module according to an embodiment of the disclosure.
Figure 3:
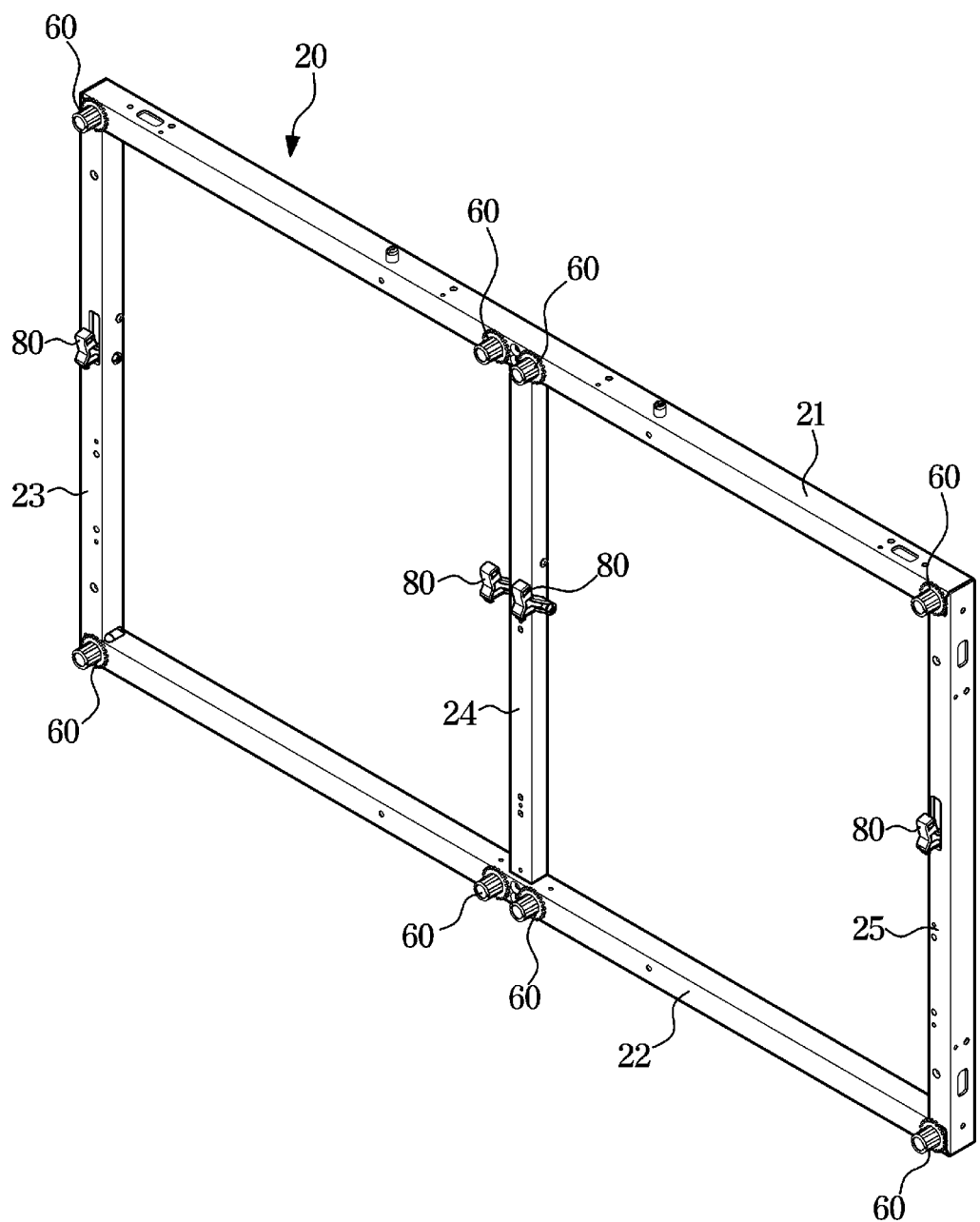
FIG. 3 is a view of the frame according to an embodiment of the disclosure.

FIG. 1 is a view of a display apparatus according to an embodiment of the disclosure. FIG. 2 is a view of a frame and a display module according to an embodiment of the disclosure. FIG. 3 is a view of the frame according to an embodiment of the disclosure.

In FIG. 1, X-axis, Y-axis, and Z-axis directions perpendicular to each other are indicated, and the X-axis direction is the left-right direction, the Y-axis direction is the up-down direction, and the Z-axis direction is the front-rear direction.

Hereinafter FIGS. 1 to 3 will be referred. A display apparatus 1 is an apparatus for displaying information, materials, and data in the form of characters, graphics and graphs. The display apparatus 1 may be implemented with an advertisement board, an electric sign board, a screen, a television, and a monitor. The display apparatus may be installed on a wall or a ceiling, or may be installed on the ground of the indoor or the outdoor by a stand (not shown).

The display apparatus 1 may include a display module 30 configured to display a screen and a frame 20 coupled to the rear of the display module 30 to support the display module 30.

The display module 30 includes a substrate 50 and a bracket 40 to which the substrate 50 is attached. Although six substrates 50 are attached to one bracket 40 according to an embodiment of the disclosure, the number of the substrates 50 attached to the bracket 40 is not limited thereto. Unlike this embodiment, only one substrate 50 may be attached to a single bracket 40, or a different number of substrates 50 may be attached to a single bracket 40. The substrate 50 may be attached to the front surface of the bracket 40 through an adhesive or a double-sided adhesive tape.

A plurality of light emitting elements 51 may be mounted on the substrate 50 and a protective member 52 may be provided on the substrate 50 to protect the light emitting element 51 or to improve optical performance.

The substrate 50 may be formed of glass, polyimide (PI), or FR4. A black layer may be formed on the entire surface of the substrate 50 to absorb external light to improve contrast.

A plurality of light emitting elements 51 may include a red LED, a green LED and a blue LED, and the red LED, the green LED, and the blue LED correspond to a sub-pixel. The plurality of light emitting elements 51 may be apart from each other with a certain distance, and the distance among the plurality of light emitting elements 51 may vary according to the resolution and size of the display apparatus 1.

The plurality of light emitting elements 51 may be formed of an inorganic material, and may include a micro-LED having a width of several micrometers (μm) to several hundreds of micrometers (μm) and a length of several micrometers (μm) to several hundreds of micrometers (μm). The plurality of light emitting elements 51 may be picked up from a silicon wafer and transferred directly onto the substrate 50.

The protective member 52 may be formed of a transparent or fluorescent material such as an acrylic resin, a polyimide resin, an epoxy resin, or a polyurethane resin, and may be formed to cover the plurality of light emitting elements 51 mounted on the substrate 50.

In this embodiment, the display apparatus 1 includes four frames 20a-20d and eight display modules 30a-30h. However, the number of frames and the number of display modules are not limited thereto.

The display modules 30 may be arranged adjacent to each other in the up-down direction (Y-axis direction) and/or the left-right direction (X-axis direction). That is, the display modules 30 may be arranged in an M*N matrix form. In this embodiment, the eight display modules 30 are arranged in the form of a 4*2 matrix.

At least one display module 30 may be coupled to a single frame 20. Two display modules 30 are coupled to the single frame 20 in the left and right side, according to an embodiment of disclosure, but is not limited thereto.

The frame 20 may be formed in a frame shape. That is, the frame 20 may include an upper horizontal frame 21, a lower horizontal frame 22, a left vertical frame 23, and a right vertical frame 25 and may have a rectangular frame shape. The frame 20 may further include a middle vertical frame 24 vertically formed to connect the upper horizontal frame 21 and the lower horizontal frame 22.

The display module 30 may be coupled to the frame 20 through a magnetic coupling device 60. The magnetic coupling device 60 may include a magnet, and the magnetic coupling device 60 may tightly couple the display module 30 to the frame 20 by the magnetic force of the magnet. A plurality of magnetic coupling devices 60 may be provided and the magnetic coupling device 60 may be installed at corners of the frame 20.

The display apparatus may include a rear cover 10 coupled to the rear of the frame 20 to cover the rear of the display apparatus 1. A control board configured to drive the plurality of display modules 30 and a power supplier configured to supply power to the plurality of display modules 30 may be disposed between the display modules 30 and the rear cover 10.

As described above, the display modules 30 are coupled to the frame 20 by the magnetic force of the magnetic coupling device 60 installed on the frame 20. Therefore, the display modules 30 may be separated from the frame 20 when an external force larger than the magnetic force of the magnetic coupling device 60 is applied.

Therefore, the display apparatus 1 according to an embodiment of the disclosure includes a separation prevention device configured to prevent the display modules 30 from being inadvertently separated from the frame 20. The separation prevention device may include a latch 80 rotatably installed in the frame 20 and a catch 71 (see FIG. 5) installed in the bracket 40 to be interacted with the latch 80. The separation prevention device may be configured to mechanically prevent the display module 30 from being separated from the frame 20 by inserting the latch 80 into the catch 71.

Hereinafter a specific configuration of the separation prevention device will be described.

Figure 4:
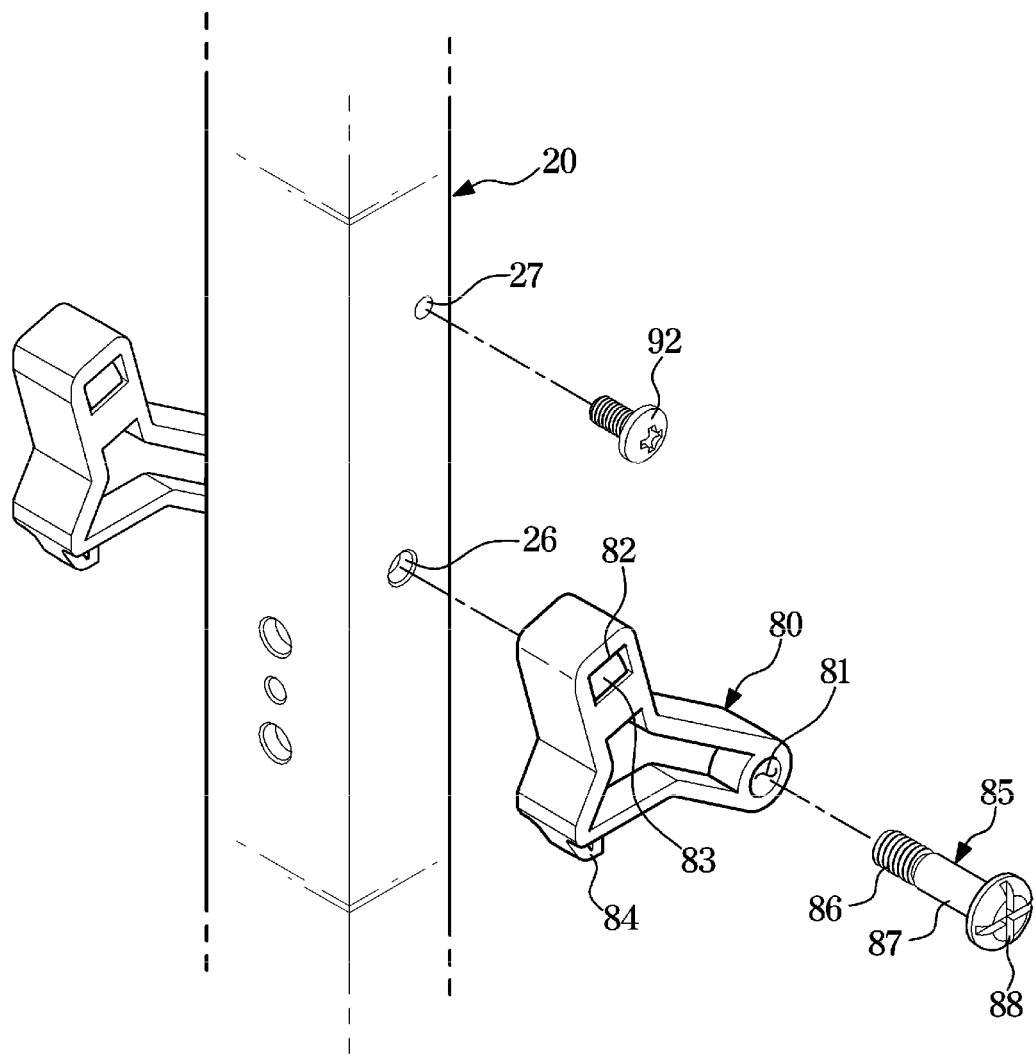
FIG. 4 is a view of a latch of a separation prevention device according to an embodiment of the disclosure.
Figure 5:
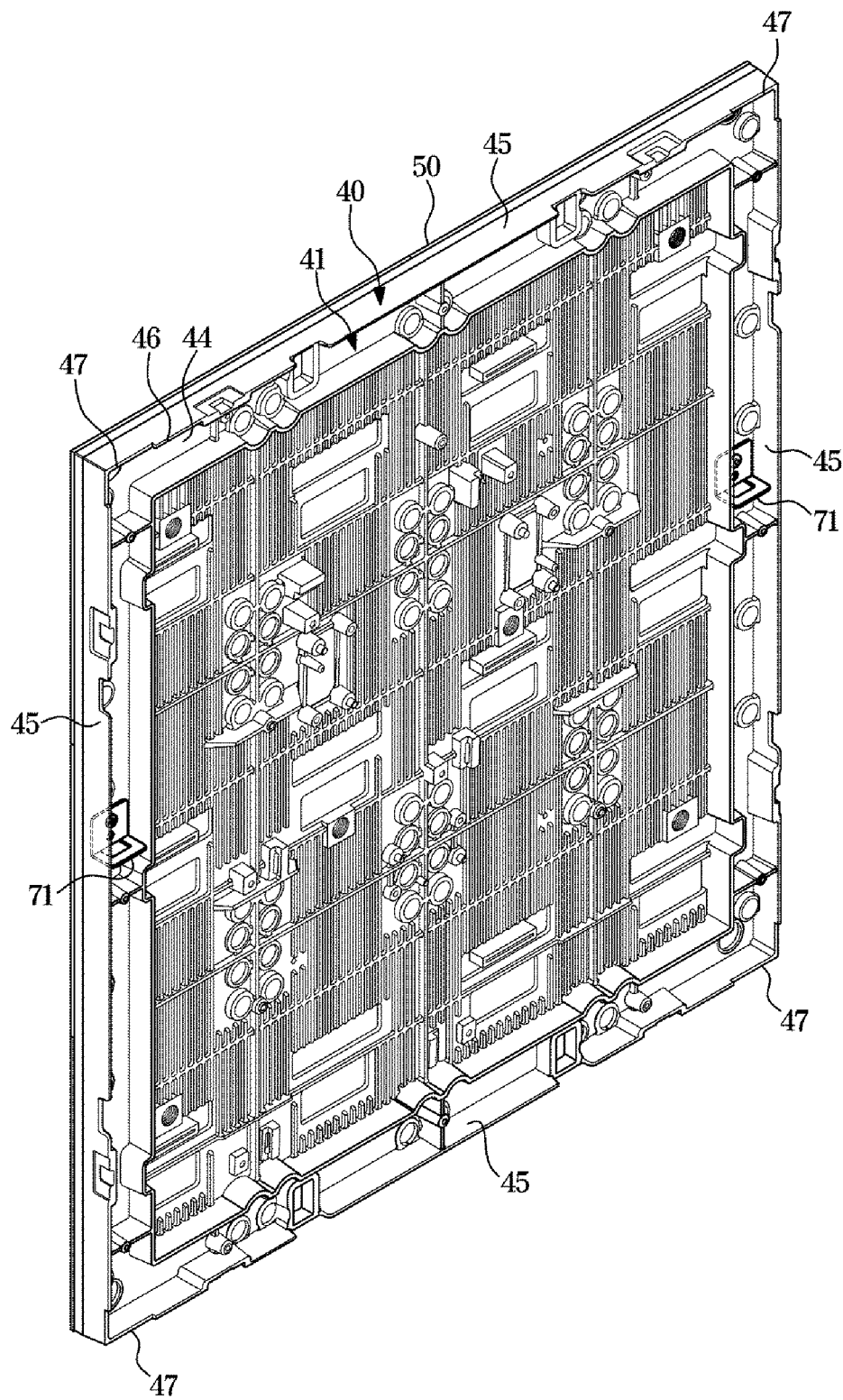
FIG. 5 is a rear perspective view of the display module according to an embodiment of the disclosure, illustrating the display module provided with a catch of the separation prevention device.
Figure 6:
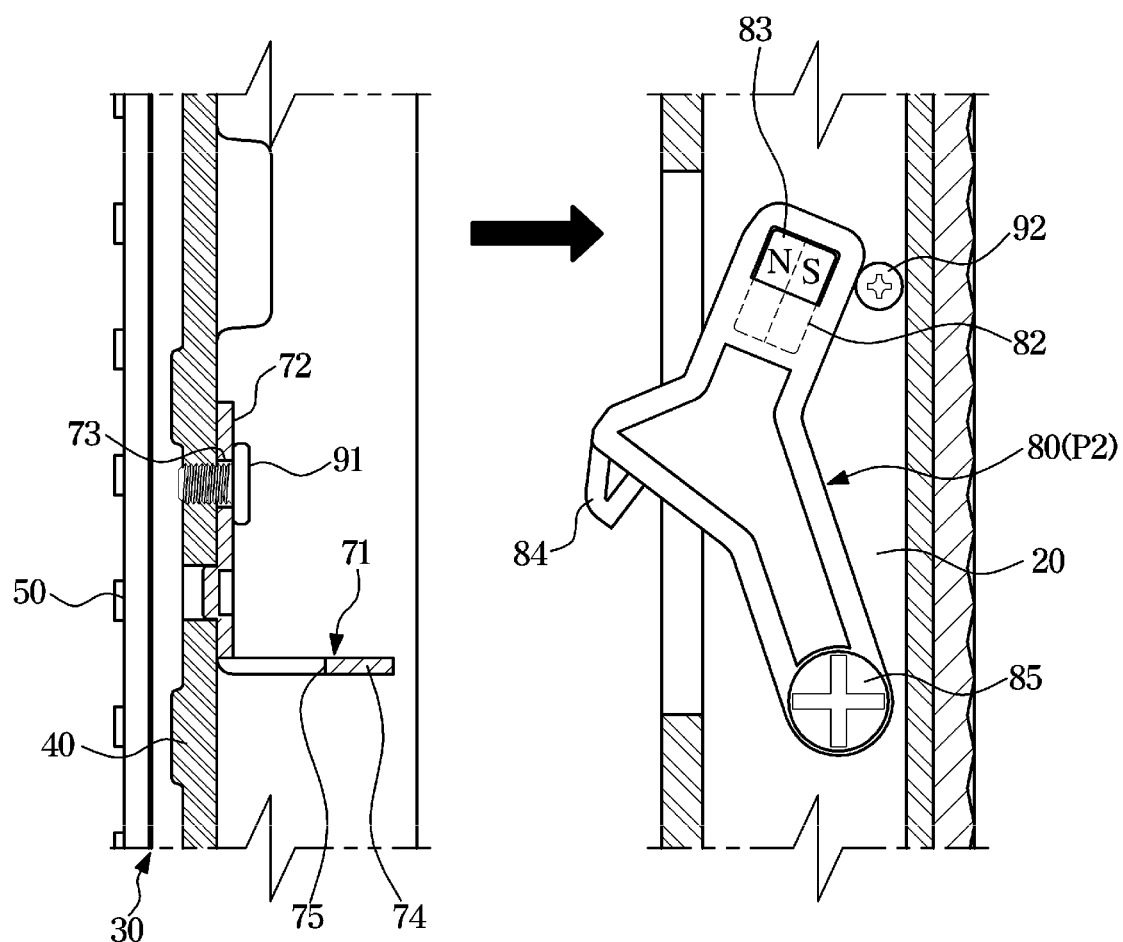
FIGS. 6 to 8 are views of locking the separation prevention device according to the embodiment of the disclosure.
Figure 7:
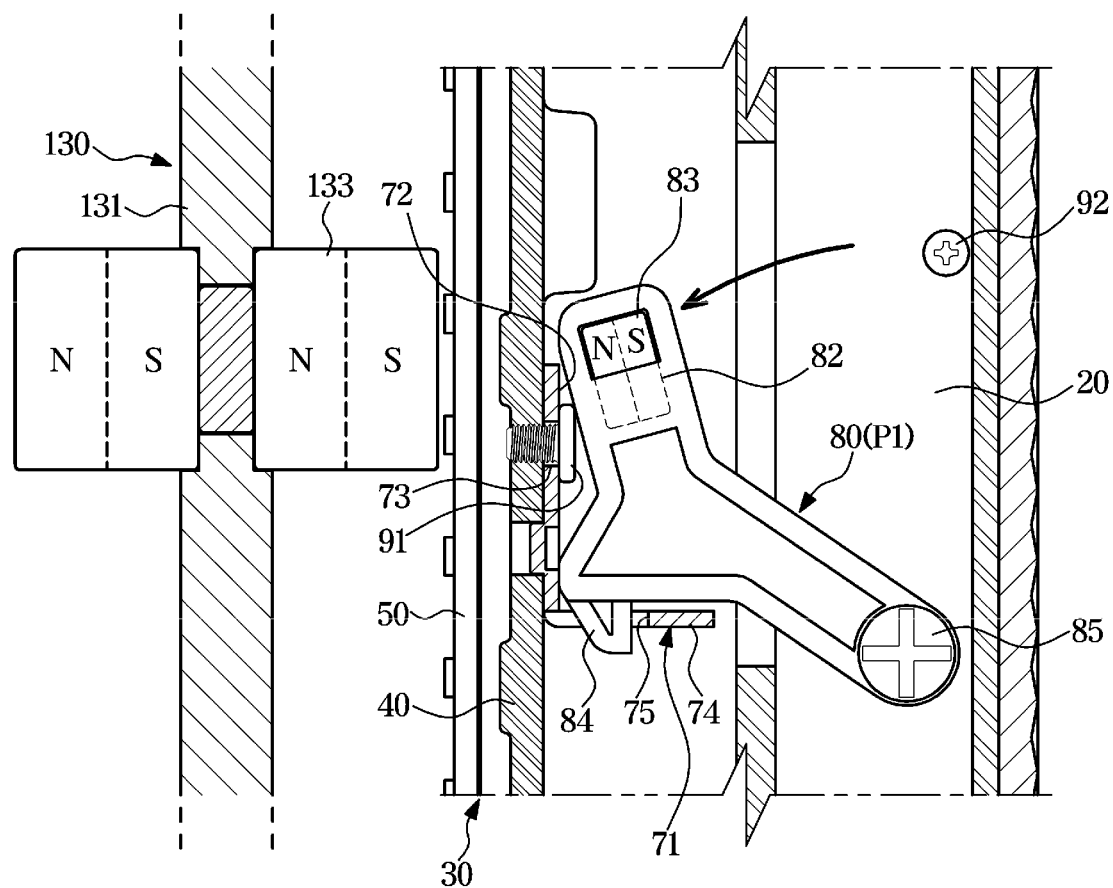
Figure 8:
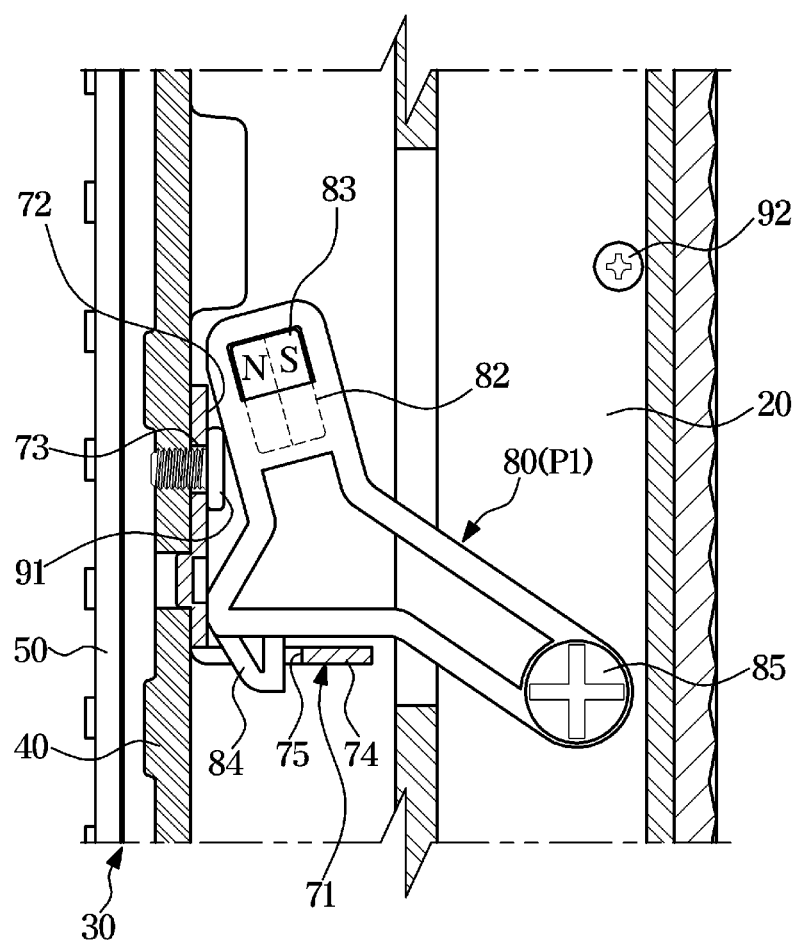
Figure 9:
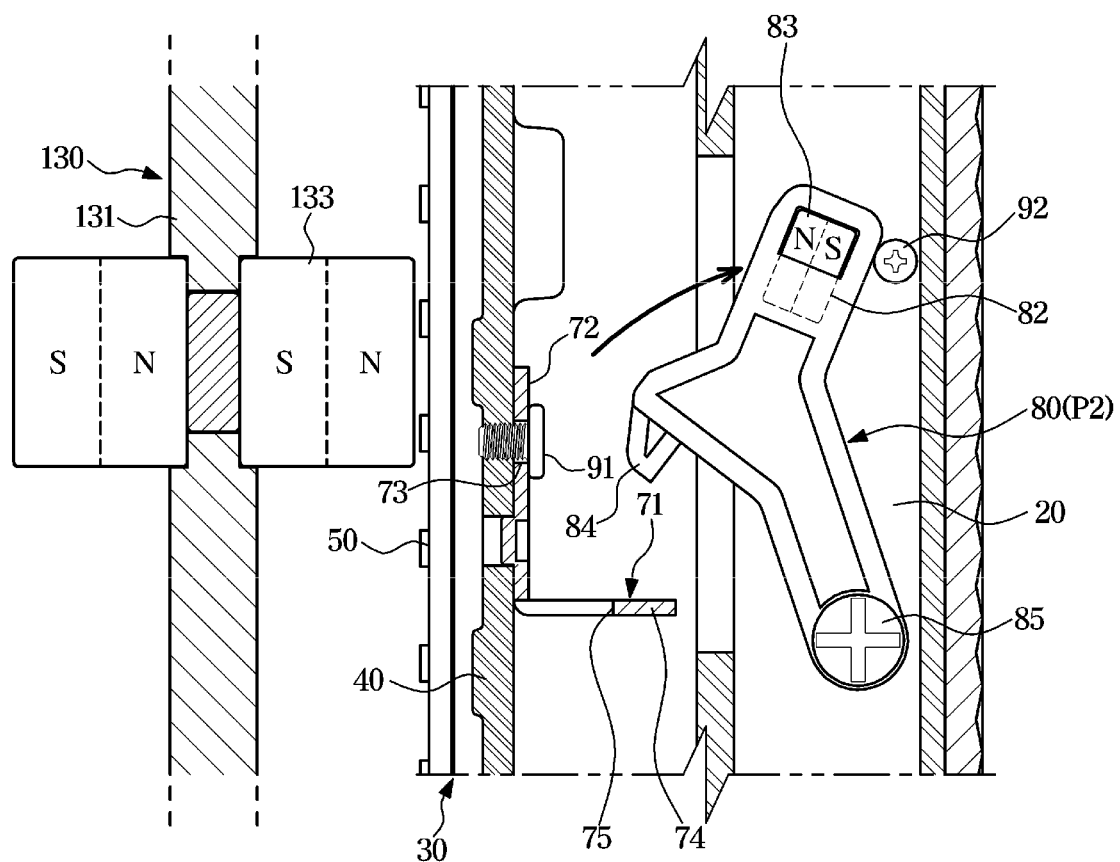
FIGS. 9 to 11 are views of unlocking the separation prevention device according to the embodiment of the disclosure.
Figure 10:
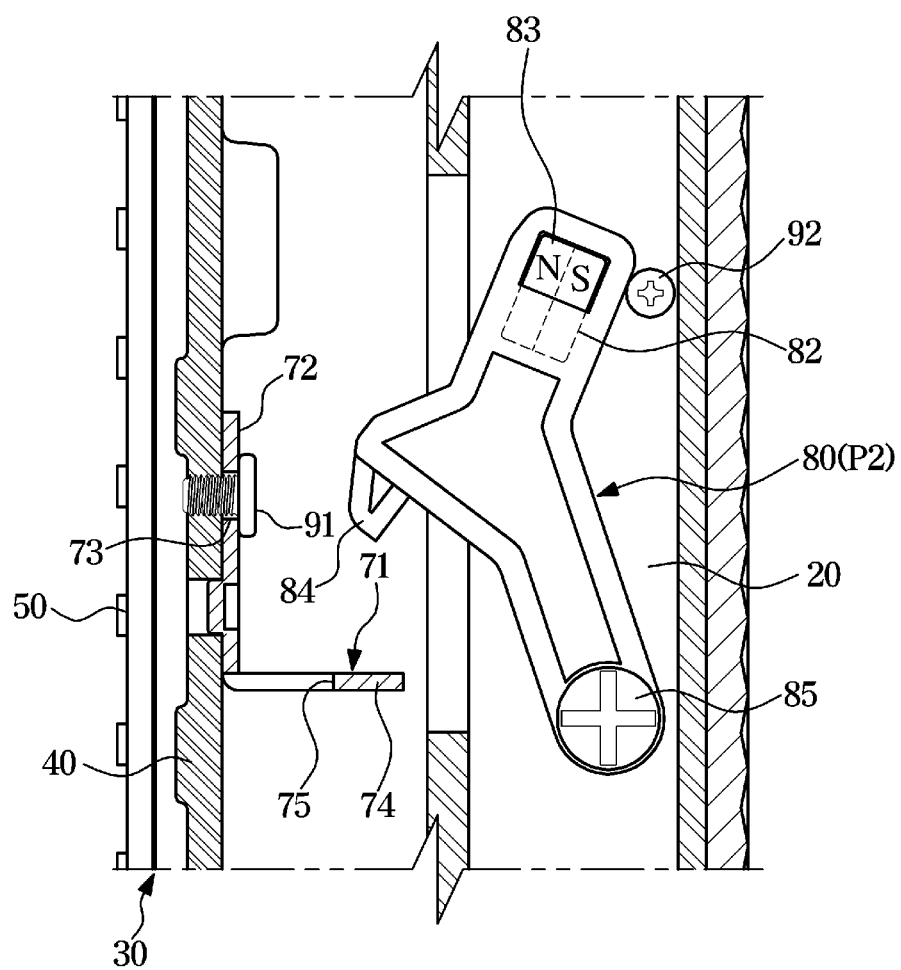
Figure 11:
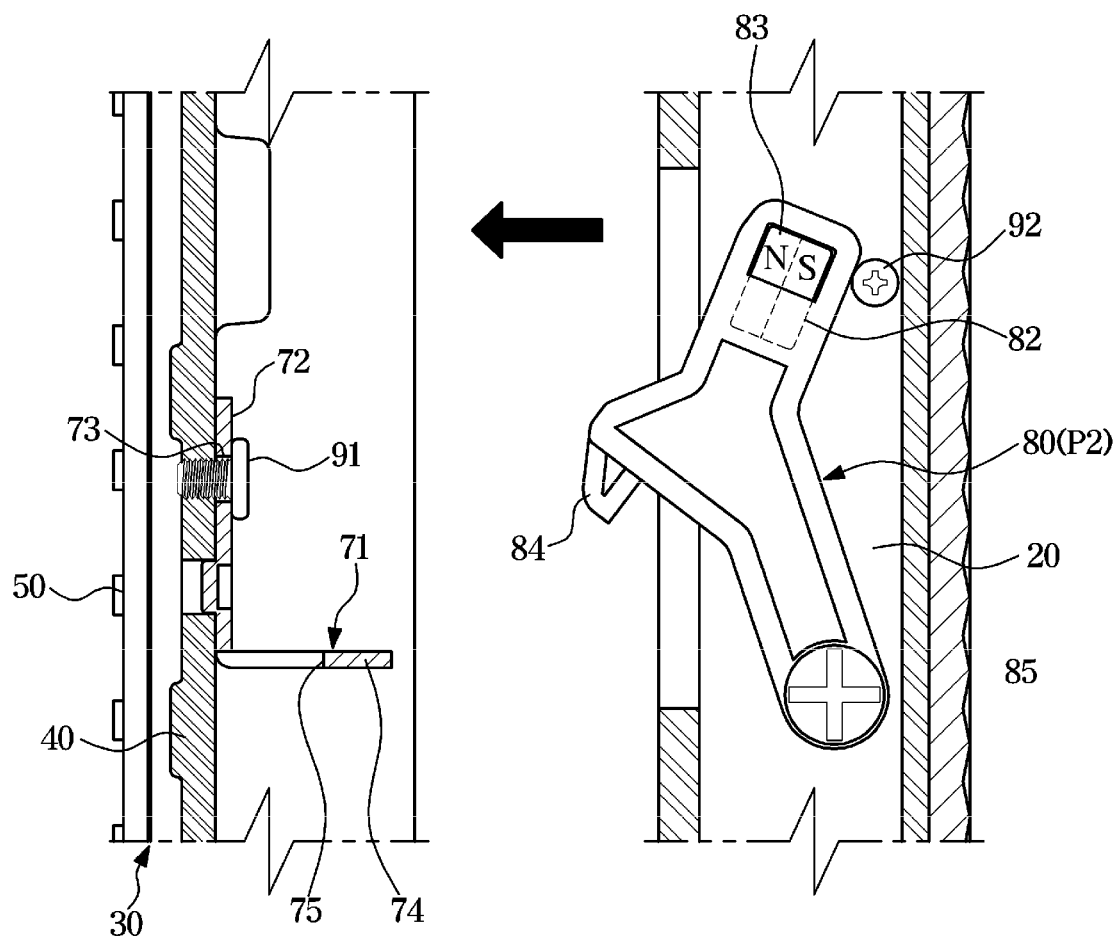

FIG. 4 is a view of a latch of a separation prevention device according to an embodiment of the disclosure. FIG. 5 is a rear perspective view of the display module according to an embodiment of the disclosure, illustrating the display module provided with a catch of the separation prevention device. FIGS. 6 to 8 are views of locking the display module by the separation prevention device according to the embodiment of the disclosure. FIGS. 9 to 11 are views of unlocking the display module by the separation prevention device according to the embodiment of the disclosure.

Referring to FIGS. 3 to 11, the separation prevention device includes the catch 71 fixed to the display module 30, and the latch 80 configured to be rotatable between a locking position P1 where the latch 80 is locked in the catch 71 and an unlocking position P2 where the engagement with the catch 71 is released.

A plurality of latches 80 may be provided and installed in the vertical frames 23, 24 and 25 of the frame 20. The latches 80 may be placed between the magnetic coupling devices 60 at the corners of the frame 20.

The latch 80 may be rotatably coupled to the frame 20. For this, a shaft hole 81 may be formed in the latch 80, and a coupling hole 26 may be formed in the frame 20. A shaft member 85 may penetrate the shaft hole 81 and the coupling hole 26. The shaft member 85 may include a shaft portion 87 forming a rotational axis of the latch 80, a male thread 86 screwed into the coupling hole 26, and a head 88 formed in one end portion of the shaft portion 87 to prevent the separation of the latch 80.

The latch 80 may include a locking protrusion 84 protruding to be inserted and locked in the locking hole 75 formed in the catch 71.

The latch 80 may be rotated by the magnetic force of the magnet. For this, the latch 80 may include a magnet mounting portion 82, and the magnet mounting portion 82 may be provided with a magnet 83. The magnet 83 may be a permanent magnet. The magnet 83 may be a soft plastic magnet, a neodymium magnet or a ferrite magnet.

With the above mentioned configuration, when a magnet, which has the magnetic attraction force with the magnet 83 of the latch 80, approaches the front side of the latch 80, the latch 80 may be rotated to the locking position P1. On the other hand, when a magnet, which has the magnetic repulsion force with the magnet 83 of the latch 80, approaches the front side of the latch 80, the latch 80 may be rotated to the unlocking position P2.

The catch 71 may be fixed to a back surface 44 of a bracket body 41 to correspond to the position of the latch 80. The bracket 40 may include the bracket body 41 formed in a plate shape to support the substrate 50, and an edge wall 45 protruding from upper, lower, left, and right edges of the bracket body 41 to the rear side. A slot 47 may be formed in a rear end portion 46 of the edge wall 45 to expose the magnetic coupling device 60.

The catch 71 may include a fixed portion 72 tightly fixed to the back surface 44 of the bracket, and an extension portion 74 bent from the fixed portion 72 and extended to the frame 20 side. The fixing portion 72 may be fixed to the back surface 44 of the bracket through a separate coupling member 91 such as a screw, nail, pin, or rivet. For this, a coupling hole 73 may be formed in the fixed portion 72 to allow the coupling member 91 to be coupled thereto.

The extension portion 74 may be provided with the locking hole 75 to which the locking protrusion 84 of the latch 80 is inserted and locked. When the locking protrusion 84 is inserted and locked in the locking hole 75, it may be possible to prevent the display module 30 from being separated from the frame 20 in the front-rear directions (X-axis direction).

The display apparatus 1 may further include a first magnetic member interacting with the magnet 83 of the latch 80 to hold the latch 80 in the locking position P1. That is, when the latch 80 is in the locking position P1, the latch 80 may be fixed in the locking position P1 by the magnetic attraction force between the magnet 83 of the latch 80 and the first magnetic member.

The first magnetic member may be a magnetic material that well magnetized such as iron, nickel and cobalt, or a magnet. The first magnetic member may include the above mentioned coupling member 91 configured to fix the catch 71 to the bracket 40.

The display apparatus 1 may further include a second magnetic member 92 interacting with the magnet 83 of the latch 80 to hold the latch 80 in the unlocking position P2. That is, when the latch 80 is in the unlocking position P2, the latch 80 may be fixed in the unlocking position P2 by the magnetic attraction force between the magnet 83 of the latch 80 and the second magnetic member 92.

The second magnetic member 92 may be a magnetic material that well magnetized such as iron, nickel and cobalt, or a magnet. The second magnetic member 92 may be a coupling member such as screw, nail, pin, or rivet, and coupled to the frame 20.

An operation of locking the separation prevention device according to an embodiment of the disclosure will be briefly described with reference to FIGS. 6 to 8.

As illustrated in FIG. 6, when the latch 80 is in the unlocking position P2, the display module 30 is moved to the frame 20 side.

As illustrated in FIG. 7, a rotating tool 130 is moved to the front of the display module 30. The rotating tool 130 may include a tool body 131 and a tool magnet 133 mounted to the tool body 131.

When a front end of the magnet 83 is the N pole and a rear end of the magnet 83 is the S pole, the rotating tool 130, in which a front end of the tool magnet 133 is the N pole and a rear end of the tool magnet 133 is the S pole, is moved to the latch 80. When the rotating tool 130 is sufficiently approached, the magnetic attraction force may be applied between the tool magnet 133 of the rotating tool 130 and the magnet 83 of the latch 80. Accordingly, the latch 80 is rotated to the locking position P1 and the locking protrusion 84 of the latch 80 is inserted and locked in the locking hole 75 of the catch 71.

When the separation prevention device is locked as described above, the latch 80 and the catch 71 may be interlocked with each other and thus it may be possible to mechanically prevent the display module 30 from being separated from the frame 20 in the front side.

As illustrated in FIG. 8, even when the rotating tool 130 is separated again, the magnetic attraction force may be applied between the magnet 83 of the latch 80 and the first magnetic member 91 installed in the bracket 40, so as to prevent the rotation of the latch 80.

An operation of unlocking the separation prevention device according to an embodiment of the disclosure will be briefly described with reference to FIGS. 9 to 11.

As illustrated in FIG. 9, the rotating tool 130, in which a front end of the tool magnet 133 is the S pole and a rear end of the tool magnet 133 is the N pole, is moved to the front of the display module 40. When the rotating tool 130 is sufficiently approached, the magnetic repulsion force may be applied between the tool magnet 133 of the rotating tool 130 and the magnet 83 of the latch 80. Accordingly, the latch 80 is rotated to the unlocking position P2 and the locking protrusion 84 of the latch 80 is released from the locking hole 75 of the catch 71.

As illustrated in FIG. 10, even when the rotating tool 130 is separated again, the magnetic attraction force may be applied between the magnet 83 of the latch 80 and the second magnetic member 92 installed in the fame 20, so as to prevent the rotation of the latch 80.

As illustrated in FIG. 11, when the locking of the separation prevention device is released, it may be possible to separate the display module 30 from the frame 20 by pulling the display module 30.

As is apparent from the above description, it may be possible to prevent the plurality of modules from being inadvertently separated from the frame, even when a constant force is applied to the plurality of modules in the direction opposite to the direction of connection, or an unexpected impact is applied to the display apparatus because the display apparatus is installed on a ceiling or an inclined surface rather than on a wall.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
a frame;
a display module comprising at least one substrate on which a plurality of light emitting elements is mounted, and a bracket to which the at least one substrate is attached;
a magnetic coupling device configured to couple the frame to the display module by pulling the display module toward the frame by using a magnetic attraction force;
a latch; and
a magnet mounted to the latch, wherein
the latch and the magnet are rotatable together as a same body between a locking position where the latch mechanically prevents the display module from being separated from the frame and an unlocking position where the latch allows the display module to be separated from the frame, in accordance with an external magnetic force applied to the magnet, and
the latch and the magnet are configured so that,
when one of an N pole and an S pole of an external magnet is moved to a front side of the display module, the external magnetic force is applied to the magnet to thereby cause the latch to be rotated from the unlocking position to the locking position and
when the other of the N pole and the S pole of the external magnet is moved to the front side of the display module, the external magnetic force is applied to the magnet to thereby cause the latch to be rotated from the locking position to the unlocking position.

2. The display apparatus of claim 1, further comprising:
a catch fixed to the display module, wherein the latch is configured to be engaged with the catch when in the locking position and to be disengaged from the catch when in the unlocking position.

3. The display apparatus of claim 2, further comprising:
a first magnetic member installed in the bracket to fix the latch in the locking position by a magnetic attraction force between the first magnetic member and the magnet mounted to the latch.

4. The display apparatus of claim 3, wherein
the first magnetic member comprises a coupling member configured to fix the catch to the bracket.

5. The display apparatus of claim 1, further comprising:
a second magnetic member installed in the frame to fix the latch in the unlocking position by a magnetic attraction force between the second magnetic member and the magnet mounted to the latch.

6. The display apparatus of claim 1, further comprising:
a shaft configured to couple the latch to the frame and to form a rotational axis of the latch.

7. The display apparatus of claim 2, wherein
the catch has a locking hole,
the latch comprises a locking protrusion, and
the latch and the catch are configured so that, when in the locking position, the locking protrusion is inserted and locked in the locking hole.

8. The display apparatus of claim 2, wherein
the catch is fixed to a back surface of the bracket.

9. The display apparatus of claim 1, wherein
the frame has a rectangular frame shape comprising a vertical frame and a horizontal frame and
the latch is mounted on the vertical frame.

10. The display apparatus of claim 9, wherein
a rotational axis of the latch is in parallel to the horizontal frame.

11. The display apparatus of claim 1, wherein
the magnetic coupling device comprises a plurality of magnetic coupling devices installed at corners of the frame, and
the latch comprises a plurality of latches installed among the plurality of magnetic coupling devices, and
the magnet comprises a plurality of magnets mounted to the plurality of latches, respectively.

12. A display apparatus comprising:
a frame;
a display module coupled to the frame by a magnetic force;
a catch installed on a back surface of the display module;
a latch installed in the frame; and
a magnet mounted to the latch, wherein the latch and the magnet are rotatable together as a same body between a locking position in which the latch is engaged with the catch and an unlocking position in which the latch is disengaged from the catch, in accordance with an external magnetic force applied to the magnet, and the latch and the magnet are configured so that,
when one of an N pole and an S pole of an external magnet is moved to a front side of the display module, the external magnetic force is applied to the magnet to thereby cause the latch to be rotated from the unlocking position to the locking position and when the other of the N pole and the S pole of the external magnet is moved to the front side of the display module, the external magnetic force is applied to the magnet to thereby cause the latch to be rotated from the locking position to the unlocking position.

13. The display apparatus of claim 12, wherein
the display module comprises a bracket, and at least one substrate attached to a front surface of the bracket and provided with a plurality of light emitting elements mounted on the at least one substrate.

14. The display apparatus of claim 13, further comprising:
a first magnetic member installed in the bracket to fix the latch in the locking position by a magnetic attraction force between the first magnetic member and the magnet mounted to the latch, and
a second magnetic member installed in the frame to fix the latch in the unlocking position by a magnetic attraction force between the second magnetic member and the magnet mounted to the latch.

15. The display apparatus of claim 12, wherein, when in the locking position, the display module is mechanically prevented from being separated from the frame due to the latch being engaged with the catch.

* * * * *

UNITED STATES PATENT AND TRADEMARK OFFICE
CERTIFICATE OF CORRECTION

PATENT NO. : 10,798,830 B2
APPLICATION NO. : 16/551035
DATED : October 6, 2020
INVENTOR(S) : Kwang Sung Hwang et al.

Page 1 of 1

It is certified that error appears in the above-identified patent and that said Letters Patent is hereby corrected as shown below:

In the Claims

Column 8, Line 48, In Claim 9, delete "horizontal frame" and insert -- horizontal frame, --, therefor.

Signed and Sealed this
Twenty-second Day of December, 2020

Andrei Iancu
*Director of the United States Patent and Trademark Office*